United States Patent
Sweeney

(10) Patent No.: US 10,020,423 B2
(45) Date of Patent: Jul. 10, 2018

(54) LIGHT EMITTING SEMICONDUCTOR DEVICE

(75) Inventor: Stephen John Sweeney, Guildford (GB)

(73) Assignee: University of Surrey, Guildford (GB)

( * ) Notice: Subject to any disclaimer, the term of this patent is extended or adjusted under 35 U.S.C. 154(b) by 320 days.

(21) Appl. No.: 13/380,950

(22) PCT Filed: Jun. 25, 2010

(86) PCT No.: PCT/GB2010/001249
§ 371 (c)(1),
(2), (4) Date: Mar. 16, 2012

(87) PCT Pub. No.: WO2010/149978
PCT Pub. Date: Dec. 29, 2010

(65) Prior Publication Data
US 2012/0168816 A1    Jul. 5, 2012

(30) Foreign Application Priority Data
Jun. 26, 2009  (GB) .................... 0911134.5

(51) Int. Cl.
*H01L 33/02* (2010.01)
*H01L 33/30* (2010.01)
(Continued)

(52) U.S. Cl.
CPC ............. *H01L 33/30* (2013.01); *B82Y 20/00* (2013.01); *H01S 5/3235* (2013.01); *H01S 5/343* (2013.01)

(58) Field of Classification Search
CPC ... H01L 33/0075; H01L 33/305; H01L 33/30; B82Y 20/00; H01S 5/343; H01S 5/3235
(Continued)

(56) References Cited

U.S. PATENT DOCUMENTS 3,874,917 A    4/1975   Wood et al.
4,813,049 A    3/1989   Becla
(Continued)

FOREIGN PATENT DOCUMENTS

CN    101454954 A    6/2009
EP    0050834 A1    5/1982
(Continued)

OTHER PUBLICATIONS

Madouri et al., "Bismuth alloying in GaAs: a first-principles study," Computational Materials Science, vol. 43, 2008, pp. 818-822.*
Achour et al., "Structural and electronic properties of GaAsBi," Superlattices and Microstructures, vol. 44, 2008, pp. 223-229.*
Yoshimoto et al., "Molecular-beam epitaxy of GaNAsBi layer for temperature-insensitive wavelength emission," Journal of Crystal Growth, 301-302, 2007, pp. 975-978.*
(Continued)

*Primary Examiner* — Hrayr A Sayadian
(74) *Attorney, Agent, or Firm* — Sheridan Ross P.C.

(57) ABSTRACT

A light emitting semiconductor device (401) has an active region (405) formed of Bismuth (Bi) and one or more other group V elements. In a particular embodiment the III-V material comprises Gallium Arsenide (GaAs) in addition to Bismuth. The inclusion of Bismuth in the III-V material raises the spin-orbit splitting energy of the material while reducing the band gap. When the spin-orbit splitting energy exceeds the band gap, Auger recombination processes are inhibited, reducing the sensitivity of the light emitting semiconductor device (401) to changes in ambient temperature.

23 Claims, 11 Drawing Sheets

(51) Int. Cl.
  *B82Y 20/00* (2011.01)
  *H01S 5/323* (2006.01)
  *H01S 5/343* (2006.01)
(58) Field of Classification Search
  USPC ..... 257/103, 615, E33.023, E29.089; 438/46
  IPC .................. B82Y 20/00; H01S 5/343,5/3235,
  H01S 33/30
  See application file for complete search history.

(56) References Cited

U.S. PATENT DOCUMENTS

| | | | |
|---|---|---|---|
| 4,835,048 | A | 5/1989 | Maeda et al. |
| 4,847,666 | A | 7/1989 | Heremans et al. |
| 4,862,236 | A | 8/1989 | Shin et al. |
| 5,381,429 | A | 1/1995 | Minemoto et al. |
| 5,793,787 | A | 8/1998 | Meyer et al. |
| 6,791,104 | B2 | 9/2004 | Tansu et al. |
| 6,815,736 | B2 * | 11/2004 | Mascarenhas ........ H01L 29/167 136/249 |
| 2002/0117675 | A1 * | 8/2002 | Mascarenhas ........ H01L 29/167 257/87 |
| 2003/0042505 | A1 * | 3/2003 | Ito et al. ................. 257/200 |
| 2003/0092230 | A1 * | 5/2003 | Koike et al. ............ 438/200 |
| 2004/0061102 | A1 | 4/2004 | Tansu et al. |
| 2004/0084667 | A1 * | 5/2004 | Takahashi ............. B82Y 20/00 257/11 |
| 2004/0140343 | A1 | 7/2004 | Jin et al. |
| 2006/0237710 | A1 * | 10/2006 | Kitatani ................. B82Y 20/00 257/12 |
| 2009/0108276 | A1 * | 4/2009 | Tu et al. .................. 257/94 |
| 2010/0226400 | A1 * | 9/2010 | Sauer .................... B82Y 20/00 372/43.01 |
| 2012/0168816 | A1 * | 7/2012 | Sweeney ............... B82Y 20/00 257/103 |

FOREIGN PATENT DOCUMENTS

| | | | | |
|---|---|---|---|---|
| EP | 00570861 | A1 | | 11/1993 |
| EP | 01031428 | A1 | | 8/2000 |
| EP | 01061588 | A2 | | 12/2000 |
| GB | 1432215 | A | * | 4/1976 ............. H01L 33/00 |
| JP | 54048567 | | | 4/1979 |
| JP | 59104996 | | | 6/1984 |
| JP | 59210543 | | | 11/1984 |
| JP | 60101988 | | | 6/1985 |
| JP | 60173894 | | | 9/1985 |
| JP | 61115252 | | | 6/1986 |
| JP | 62079608 | | | 4/1987 |
| JP | 04241046 | | | 8/1992 |
| JP | 07036191 | | | 2/1995 |
| JP | 09008405 | A | * | 1/1997 |
| JP | 2007180276 | A | | 7/2007 |
| WO | WO-2002/065553 | A1 | | 8/2002 |
| WO | WO-2007103527 | A2 | | 9/2007 |
| WO | WO-2008/064357 | A2 | | 5/2008 |
| WO | WO-2009/079777 | A1 | | 7/2009 |

OTHER PUBLICATIONS

Pacebutas et al., "Characterization of low-temperature molecular-beam-epitaxy grown GaBiAs layers," Semicond. Sci. Technol., vol. 22, 2007, pp. 819-823.*
Machine English translation of JP 09008405 A.*
Englsih Abstract of JP 09008405 A.*
English translation of First Office Action and Search Report dated Jan. 2, 2014 for Chinese Patent Application No. 201080037476.2 filed Jun. 25, 2010 (Applicant—University of Surrey; Inventors—Sweeney, et al.) (41 pages).
Alberi, et al. (2007) Valence band anticrossing in GaBixAs1-x. Applied Physics Letters, 91: 051909-1-051909-3.
Fluegel, et al. (2006) Giant Spin-Orbit Bowing in GaAs1-xBix. Physical Review Letters, 97: 067205.
Francoeur, et al. (2003) Band gap of GaAs-1-xBix, 0<x<3.6%. Applied Physics Letters, 82(22): 3874-3876.
Kasap S, et al. (2006) Optoelectronic Devices and Materials—Springer Handbook of Electronic and Photonic Materials, 887-916.
Pacebutas V, et al. (2007) Characterization of low-temperature molecular-beam-epitaxy grown GaBiAs layers. Semiconductor Science and Technology, 22(7): 819-823.
Sweeney. EPSRC Reference EPIG06472511, Materials World Network: 111-V Bismide Materials for IR and Mid IR Semiconductors. University of Surrey, Accessed 2009.
Tiedje T, et al. (2008) Growth and properties of the dilute bismide semiconductor GaAs1—xBix a complementary alloy to the dilute nitrides. International Journal of Nanotechnology, 5: 963-983.
International Preliminary Report on Patentability issued by the International Bureau dated Jan. 4, 2012 for International Application No. PCT/GB2010/001249 filed Jun. 25, 2010 and published as WO 2010/149978 on Dec. 29, 2010 (Applicants—University of Surrey, et al.; Inventors—Sweeney, et al.) (7 pages).
International Search Report mailed by the International Bureau dated Oct. 4, 2010 for International Application No. PCT/GB2010/001249 filed Jun. 25, 2010 and published as WO 2010/149978 on Dec. 29, 2010 (Applicants—University of Surrey, et al.; Inventors—Sweeney, et al.) (4 pages).
Written Opinion mailed by the International Bureau dated Oct. 4, 2010 for International Application No. PCT/GB2010/001249 filed Jun. 25, 2010 and published as WO 2010/149978 on Dec. 29, 2010 (Applicants—University of Surrey, et al.; Inventors—Sweeney, et al.) (6 pages).
Batool et al. "The electronic band structure of GaBiAs/GaAs layers: Influence of strain and band anti-crossing," Journal of Applied Physics, Jun. 2012, vol. 111, No. 11 113108-1, 8 pages.
Petropoulos et al. "Thermoelectric and Optoelectronic Properties of Dilute Bismuthide Materials on InP Substrates," Applied Physical Letters, 2011, vol. 99, 21 pages.
Vurgaftman et al. "Band parameters for III-V compound semiconductors and their alloys," Journal of Applied Physics, Jun. 2001, vol. 89, No. 11, pp. 5815-5875.
Wang et al. "InPBi Single Crystals Grown by Molecular Beam Epitaxy," Scientific Reports, Jun. 2014, vol. 4, 6 pages.

* cited by examiner

LIGHT EMITTING SEMICONDUCTOR DEVICE

CROSS REFERENCE TO RELATED APPLICATIONS

The present application is a National Phase Application of International Application No. PCT/GB2010/001249 filed Jun. 25, 2010, which claims priority to Great Britain Patent Application No. 0911134.5 filed Jun. 26, 2009, which applications are incorporated herein fully by this reference.

TECHNICAL FIELD OF THE INVENTION

The present invention relates to a light emitting semiconductor device. The invention is particularly, but not exclusively, applicable to a semiconductor laser, light emitting diode (LED), superluminescent light emitting diode (SLED) or optical amplifier and is especially relevant to devices operating at infrared (IR) wavelengths.

BACKGROUND TO THE INVENTION

Light emitting inter-band semiconductor devices emit light when an energetic electron in the conduction band recombines with a hole in the valence band. Recombination of the electron and hole results in a release of energy in the form of emission of a photon. The smallest difference in energy between the conduction band and valence band, known as the band gap energy $E_g$, broadly dictates the amount of energy released on recombination of the electron and hole. This amount of energy in turn dictates the wavelength of the photon emitted. Different semiconductor materials have different band gap energy $E_g$, and the material used to form an active region of a light emitting semiconductor device is therefore selected primarily according to the wavelength of light it is desired that the device emits.

Materials used to form the active region of light emitting semiconductor devices that emit light at IR wavelengths typically comprise group III-V materials, as these tend to have suitable band gaps for emission at IR wavelengths. A problem with such materials is that their properties are strongly dependent on temperature.

Taking a semiconductor laser as an example, there is a threshold current $I_{th}$ at which the emission of coherent light by the laser begins and a slope efficiency representing the change in power of the optical output in relation to the change in power of the electrical input. Both the threshold current $I_{th}$ and the slope efficiency are sensitive to temperature, and usually particularly so at and around room temperature. For example, FIG. 1 shows the relationship between the optical power of light output by a conventional 1.5 µm InGaAsP laser and electrical current input to the laser across a range of temperatures. It can be seen that the threshold current $I_{th}$, which is the current at which the optical power abruptly increases, increases with increasing temperature. It can also be seen that, for a constant bias current the optical power decreases significantly with increasing temperature. The relationship between power and temperature at a fixed bias current is shown in FIG. 2.

Referring to FIG. 3, it can be seen that at low, e.g. cryogenic, temperatures the threshold current $I_{th}$ of the 1.5 µm InGaAsP laser is almost entirely due to light producing radiative recombination (the radiative current) which increases linearly with increasing temperature. However, above approximately 260K the threshold current $I_{th}$ increases strongly. The increase is exponential and therefore wide variations in threshold current $I_{th}$ occur in the temperature range of 293K to 353K (approximately 20° C. to 80° C.), which is the ambient temperature range for most applications.

In order to mitigate the difficulties arising from the temperature dependence of such semiconductor lasers, thermo-electric control (TEC) is used to maintain a constant temperature and stabilise the threshold current. However, this adds considerable expense to the cost of a semiconductor laser and dramatically increases energy usage. The 1.5 µm InGaAsP laser typically requires around 10 mW of electrical power to achieve laser threshold. However, it will typically require approximately 600 mW of electrical power for the TEC. Therefore only around 2% of the inputted electrical power is used to produce laser emission.

SUMMARY OF THE DISCLOSURE

According to a first aspect, there is provided a light emitting semiconductor device having an active region comprising a III-V material including Bismuth and one or more other group V elements, wherein the percentage of atoms of Bismuth to atoms of the other group V elements in the material is in the range of 3% to 15% and is such that the spin-orbit splitting energy of the material is greater than the band gap energy of the material.

According to a second aspect, there is provided a method of manufacturing a light emitting semiconductor device, the method comprising providing as an active region a III-V material including Bismuth and one or more other group V elements, wherein the percentage of atoms of Bismuth to atoms of the other group V elements in the material is in the range of 3% to 15% and is such that the spin-orbit splitting energy of the material is greater than the band gap energy of the material.

According to a third aspect, there is provided III-V material including Bismuth and one or more other group V elements, wherein the percentage of atoms of Bismuth to atoms of the other group V elements in the material is in the range 3% to 15% and is such that the spin-orbit splitting energy of the III-V material is greater than the band gap energy of the III-V material. This material may be used as the active region of a light emitting semiconductor device According to a fourth aspect, there is provided a light emitting semiconductor device having an active region comprising a III-V material including Bismuth and one or more other group V elements, wherein the percentage of atoms of Bismuth to atoms of the other group V elements in the material is in the range 3% to 15%.

According to a fifth aspect, there is provided a method of manufacturing a light emitting semiconductor device, the method comprising providing as an active region a III-V material including Bismuth and one or more other group V elements, wherein the percentage of atoms of Bismuth to atoms of the other group V elements in the material is in the range 3% to 15%.

According to a sixth aspect, there is provided a III-V material including Bismuth and one or more other group V elements, wherein the percentage of atoms of Bismuth to atoms of the other group V elements in the material is in the range 3% to 15%. This material may be used in a light emitting semiconductor device.

According to a seventh aspect, there is provided a light emitting semiconductor device having an active region comprising III-V material including Bismuth and two or more other group V elements, wherein the percentage of atoms of Bismuth to atoms of the other group V elements in the material is such that the spin-orbit splitting energy of the material is greater than the band gap energy of the material.

According to an eighth aspect, there is provided a method of manufacturing a light emitting semiconductor device, the method comprising providing as an active region a III-V material including Bismuth and two or more other group V elements, wherein the percentage of atoms of Bismuth to atoms of the other group V elements in the material is such that the spin-orbit splitting energy of the material is greater than the band gap energy of the material.

According to a ninth aspect, there is provided a III-V material including Bismuth and two or more other group V elements, wherein the percentage of atoms of Bismuth to atoms of the other group V elements in the material is such that the spin-orbit splitting energy of the material is greater than the band gap energy of the material. This material may be used in a light emitting semiconductor device.

Preferably, the percentage of atoms of Bismuth to atoms of the other group V element(s) is in the range 5% to 15%. In a preferred embodiment, the percentage of atoms of Bismuth to atoms of the other group V element(s) in the material is approximately 10%. More generally, the desired percentage of atoms of Bismuth to atoms of the other group V element(s) will depend on factors such as the wavelength of light it is desired to for the III-V material to emit and which group V elements are used.

The device may emit infrared light. Preferably, the device may emit light having wavelength between 1.3 μm and 6.0 μm. More preferably, the device may emit light having wavelength between 1.3 μm and 2.0 μm.

The group III element may be Gallium. Alternatively, it may be Indium, Aluminium or Boron, or any combination of these elements. A combination of two of these elements or three of these elements may be selected.

The other group V element or one of the other group V elements may be Arsenic. Additionally or alternatively, the other group V element or one of the other group V elements may be Nitrogen, Phosphorous or Antimony. In preferred embodiments, there are two or more group V elements. In particular, the III-V material may be GaInAsBi or GaInPBi. It a particularly preferred embodiment, one of the two or more other group V elements is Nitrogen. In particular embodiment, the III-V material is GaAsBiN. The percentage of atoms of Nitrogen to atoms of Bismuth and the other group V element(s) except Nitrogen in the material may be less than or equal to 10%. Alternatively, it may be less than or equal to 5%.

The active region may comprise a first portion comprising the III-V material including Bismuth and the one or more other group V elements, and a second portion comprising another III-V material. The other III-V material may be one of the III-V materials mentioned above, with the omission of Bismuth. Indeed, the two III-V materials may comprise or even constitute the same elements the same elements as each other, except for the other III-V material including a different group V element instead of Bi. In a particularly preferred embodiment, the other III-V material includes Nitrogen. For example, the III-V material including Bismuth and the one or more other group V elements may be GaAsBi and the other III-V material may be GaASN.

The device may be a laser, such as an edge-emitting semiconductor laser, distributed feedback laser or vertical cavity surface emitting laser. Alternatively, the device may be a light emitting diode, such as a super-luminescent light emitting diode. In another alternative, the device may be an optical amplifier, such as a vertical cavity semiconductor optical amplifier.

Preferred embodiments of are described below, by way of example only, with reference to the accompanying drawings.

BRIEF DESCRIPTION OF THE DRAWINGS

FIG. 4b is a close-up view of an active layer of the edge emitting semiconductor laser shown in FIG. 4a.

FIG. 7 is an energy band diagram showing the energy band alignment for the edge emitting semiconductor shown in FIG. 4a.

FIG. 13 is a graph showing threshold current versus temperature for an edge emitting semiconductor laser where non-radiative processes are not suppressed and for the edge emitting semiconductor laser shown in FIG. 4a.

FIG. 14 is a graph of threshold current versus temperature for the edge emitting semiconductor laser of FIG. 4a.

DETAILED DESCRIPTION OF PREFERRED EMBODIMENTS

Figure 1:
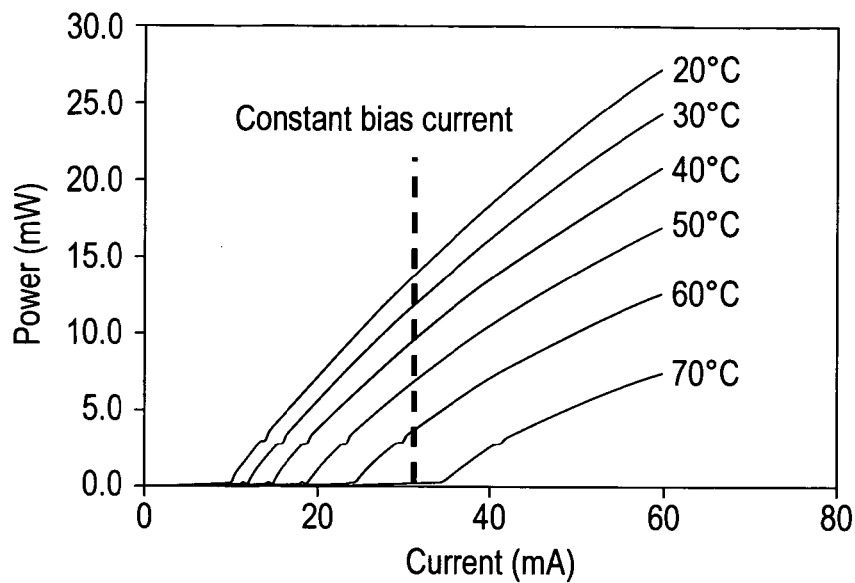
FIG. 1 is a graph showing the relationship between output power and input current for a prior art InGaAsP laser operating at 1.5 μm, at various temperatures over the range 20-70° C.
Figure 2:
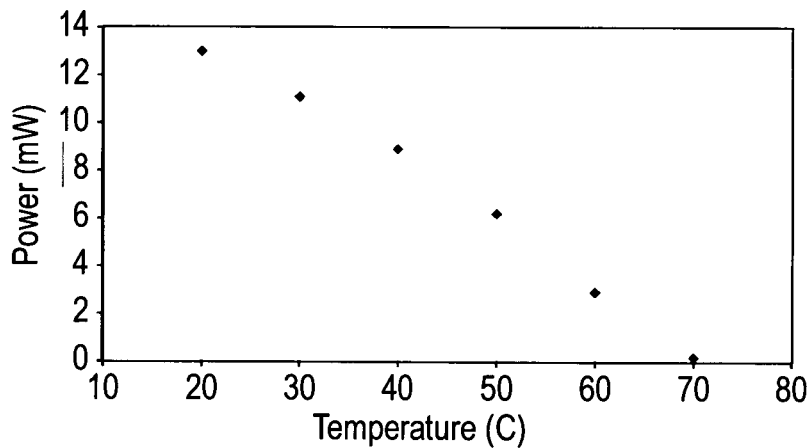
FIG. 2 is a graph showing the temperature dependence of optical power in a prior art InGaAsP laser operating at 1.5 μm.
Figure 3:
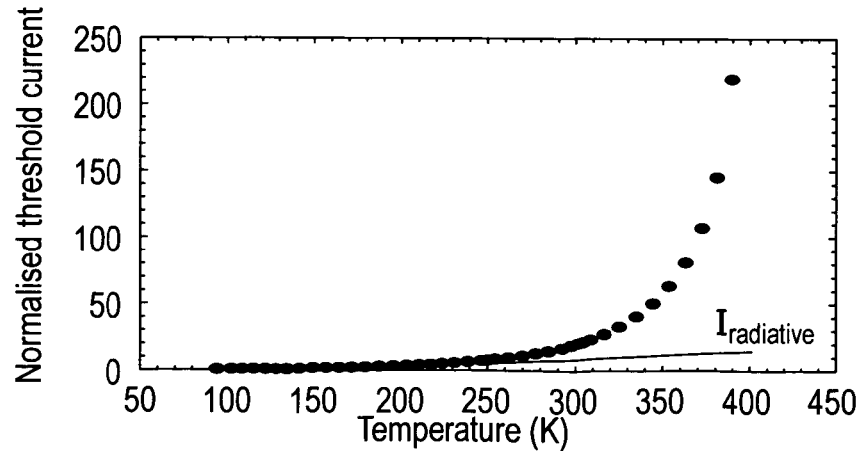
FIG. 3 is graph showing the temperature dependence of the threshold current $I_{th}$ and its radiative component $I_{rad}$ in a prior art InGaAsP laser operating at 1.5 μm.
Figure 4A:
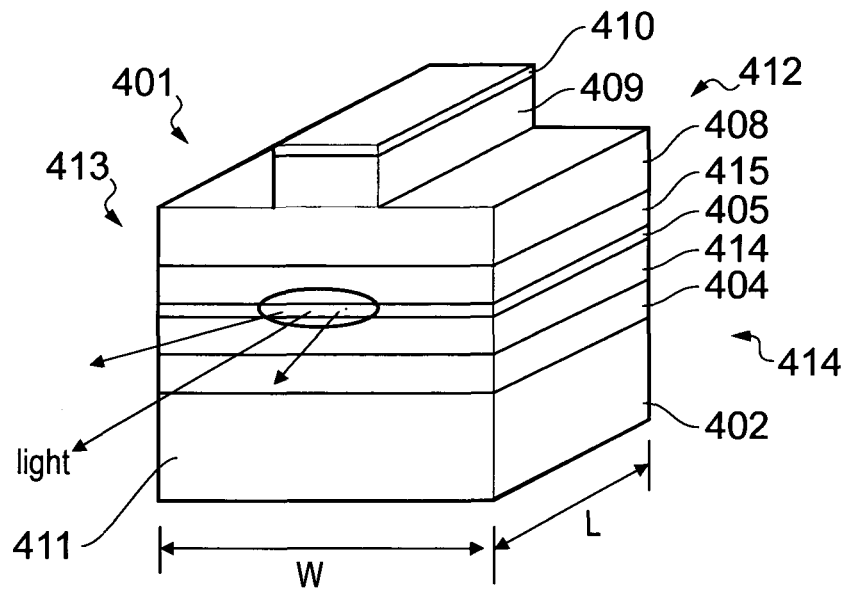
FIG. 4a is a schematic representation of an edge emitting semiconductor laser having an active region comprising $GaAs_{1-x}Bi_x$.

Referring to FIG. 4a, according to a first preferred embodiment of the invention, there is provided an edge-emitting semiconductor laser 401. The laser 401 comprises an n-type cladding layer 404, a first intrinsic waveguide layer 414, an active layer 405, a second intrinsic waveguide layer 415 and a p-type cladding layer 408 disposed on top of one another, in that order from the bottom up, on a substrate 402.

The laser 401 has a length L from one end to another and a width W from one side to another. Light reflective end faces 411, 412 are provided at each end of the laser 401. The light reflective end faces 411, 412 traverse at least the active layer 405. In this embodiment they extend over the entire height of the laser 401. The length L of the laser 401 between the light reflective end faces 411, 412 is selected as an integer number N of half-wavelengths $\lambda/2$ of the light emitted by the laser 401. In this embodiment, the length L is approximately 500 μm. Side faces 413, 414 on each of the two sides of the laser 401 have rough surfaces in order to reduce reflectivity in comparison to the light reflective end faces 411, 412. This reduces the production of unwanted transverse modes of light propagation in the laser 401.

A current injection ridge 409 is provided on top of p-type cladding layer 408. The current injection ridge 409 extends along the length L of the laser 401. It is located centrally to the width W of the laser 401, but only extends across part of the width W. In other words, the current injection ridge 409 is narrower that the width W of the laser 401. On the top surface of the current injection ridge 409 is an electrical contact 410.

In this embodiment, the substrate 402 comprises an n-doped Gallium Arsenide (GaAs) wafer, such as available from Wafer Technology Ltd. The n-type cladding layer 404 is Aluminium Gallium Arsenide (AlGaAs) doped with Germanium (Ge). The p-type cladding layer 408 is GaAs doped with Silicon (Si). The first and second intrinsic waveguide layers 414, 415 are GaAs. The current injection ridge is GaAs doped with Si.

The n-type cladding layer 404 and p-type cladding layer 408 each have a thickness of a few μm. The intrinsic waveguide layers 414, 415 and active layer 405 have a combined thickness of $\lambda/2\mu$, where $\lambda$ is the wavelength of light emitted by the laser 401 and $\mu$ is the average refractive index of the intrinsic waveguide layers 414, 415 and active layer 405. In this embodiment $\lambda \approx 5$ μm and $\mu \approx 3$, so the combined thickness of intrinsic waveguide layers 414, 415 and active layer 405 is approximately 250 nm. The current injection ridge 409 has a thickness of 500 nm and is 10 μm wide.

Figure 4B:
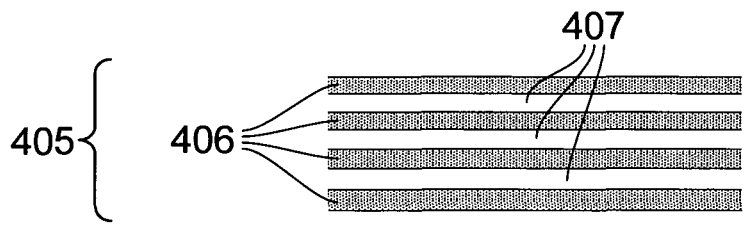

Referring to FIG. 4b, the active layer 405 comprises a plurality of active regions 406 separated by a plurality of barrier regions 407. In this embodiment, there are four active regions 406 and three barrier regions 407. One active region 406 is located at the top of the active layer 405 and one active region 406 is located at the bottom of the active layer 405. Between the top and bottom active regions 406, barrier regions 407 and active regions 406 are alternately disposed.

The active regions 406 comprise Gallium Arsenide Bismide ($GaAs_{1-x}Bi_x$). The percentage x of atoms of group V elements in the $GaAs_{1-x}Bi_x$ that are Bismuth (Bi) is selected such that the spin-orbit splitting energy $\Delta S0$ of the $GaAs_{1-x}Bi_x$ is greater than the band gap energy $E_g$ of the $GaAs_{1-x}Bi_x$. More specifically, as the percentage x of atoms of group V elements that are Bi increases, the band gap energy $E_g$ of the $GaAs_{1-x}Bi_x$ decreases and the spin-orbit splitting energy $\Delta S0$ of the $GaAs_{1-x}Bi_x$ increases. At around x=10%, these two energies are equal. At greater percentages of x, the band gap energy $E_g$ is less than the spin-orbit splitting energy $\Delta S0$. Typically, for the edge-emitting semiconductor laser 401 to emit light at a useful wavelength and to be readily manufacturable, x is between 5% and 15%.

Figure 5:
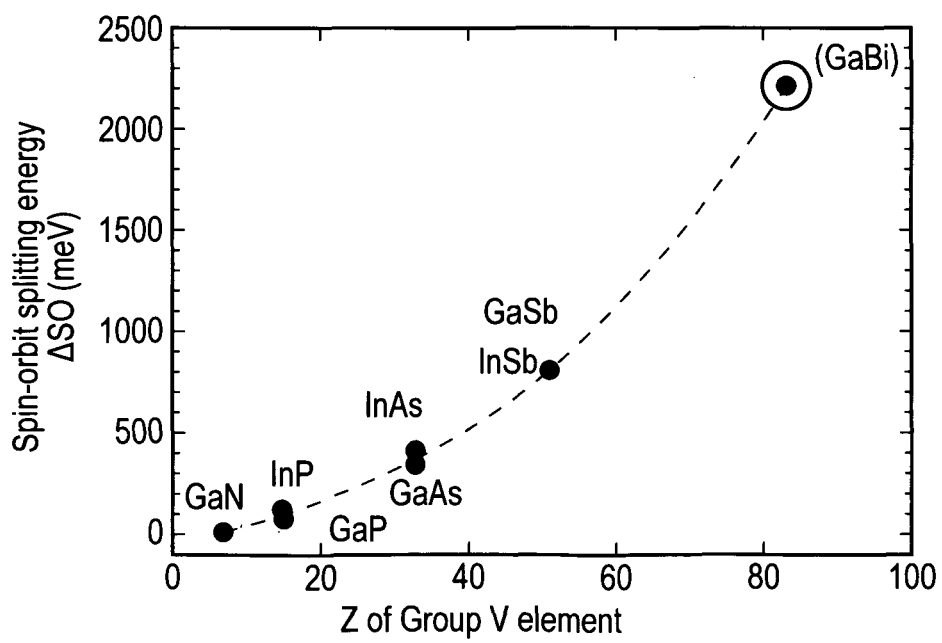
FIG. 5 is a graph showing how the spin-orbit splitting energy varies with the group V atomic number in III-V compound semiconductors.

Referring to FIG. 5, spin-orbit splitting in III-V materials is strongly dependent on the atomic number of the group V atoms. Higher atomic number group V elements give rise to a larger spin-orbit splitting. Therefore the addition of group V elements with higher atomic number to a III-V material having group V elements with lower atomic number increases the spin-orbit splitting.

Figure 6:
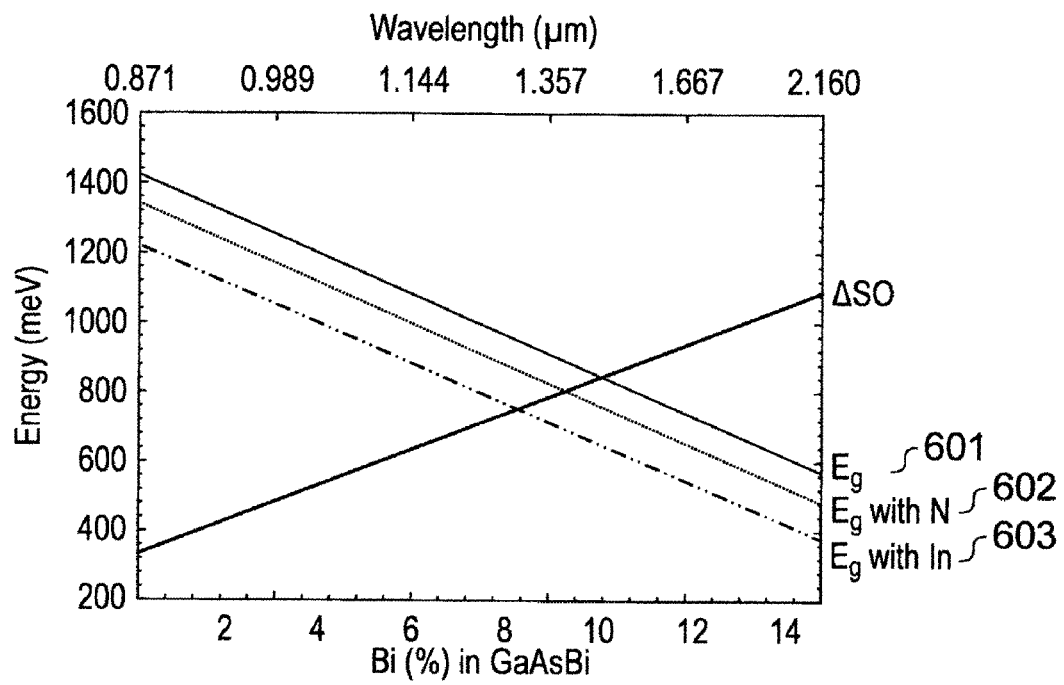
FIG. 6 is a graph showing the relationship between the spin orbit splitting energy $\Delta_{SO}$ and band gap $E_g$ of $GaAs_{1-x}Bi_x$ as a function of Bismuth concentration, and also illustrating the effect of introducing Nitrogen and Indium to the alloy.

FIG. 6 shows the dependence of spin-orbit splitting energy $\Delta SO$ on the percentage x of atoms of group V elements in the $GaAs_{1-x}Bi_x$ that are Bismuth (Bi). It can be seen that for a pure GaAs material, i.e. x=0, the band gap $E_g$ is greater than the spin-orbit splitting energy $\Delta S0$, but as Bi is added and x increases, the band gap $E_g$ decreases while the spin-orbit splitting energy $\Delta S0$ increases.

In more detail, the valence band of a semiconductor material comprises a number of discrete energy bands, including a spin-orbit splitting band SO. The spin-orbit and SO owes its existence to coupling between electrons and the nucleus, and for a large nucleus this coupling is particularly strong and the spin-orbit splitting is large. Therefore spin-orbit splitting energy $\Delta S0$ is a strong function of atomic number. Bismuth is the largest stable group V element, with atomic number 83, and exhibits the greatest degree of spin-orbit splitting of the group V elements. The addition of Bismuth to a III-V material will decrease the band gap $E_g$ of the material and increase the spin-orbit splitting energy $\Delta S0$ to a point where the band gap $E_g$ and the spin-orbit splitting energy $\Delta S0$ are equal and eventually spin-orbit splitting energy $\Delta S0$ exceeds the band gap $E_g$.

Four active regions 406 is an optimal number, but any number of active regions 406 can be provided. Generally, as more active regions 406 are provided, the amount of strain in the structure of the active layer 405 increases. This strain can be compensated for by the barrier regions 407. In this embodiment, the barrier regions comprise GaAs, but they can alternatively comprise un-doped Gallium Arsenide Phosphide (GaAsP), Gallium Arsenide Nitride (GaAsN) or some other semiconductor with an inherent tensile strain.

Each of the active regions 406 has a thickness of between 2 nm and 15 nm. This is comparable to the wavelength of electrons and holes in the laser 401, which is around 5 nm. This allows each of the active regions 406 to provide quantum confinement of the electrons and holes. The plurality of active regions 406 in the active layer 405 provides a repeating quantum well structure in the active layer 405, which can help to provide a high density of photons in the active layer 405. This in turn maximises the probability of stimulated emission of photons in the active regions 406. Adjusting the thickness of the active regions 406 can fine tune the energy of the emitted photons.

The laser 401 is fabricated by Molecular Beam Epitaxy (MBE) or Metal-Organic Chemical Vapour Deposition (MOCVD), where the various layers are grown in sequence under ultra high vacuum. First, n-type cladding layer 404 is provided on the substrate 402 by depositing AlGaAs and simultaneously doping it with Ge. The first intrinsic waveguide layer 414 is then provided on the n-type cladding layer 404 by depositing GaAs. Next, a first active region 406 is provided on the first intrinsic waveguide layer 414, by growing $GaAs_{1-x}Bi_x$ on the first intrinsic waveguide layer 414, where x is chosen to ensure that the spin-orbit splitting energy $\Delta S0$ is greater than the band gap energy $E_g$. A first barrier region 407 is then provided on the first active region 406 by growing GaAs on the first active region 406. A second active region 406 is then provided on the first barrier region 407 and subsequently second barrier region 407 is provided on the second active region 406 in the same way. The provision of active regions 406 and barrier regions 407 is repeated in turn until a final, fourth active region 406 has been provided. The second intrinsic waveguide layer 415 is then provided on the fourth barrier region 407 by growing GaAs. The p-type cladding layer 408 and current injection ridge 409 are then provided on the second intrinsic waveguide layer 415 by growing GaAs doped with Si and etching the grown material to provide a first layer of the required thickness to form the p-type cladding layer 415 and a second layer of the required width and thickness to form the current injection ridge 409. The top surface of the current ridge 409 is then metalised to form electrical contact 410. Finally, the substrate and the layers that have been provided on it are cleaved from top to bottom to provide light reflective end faces 411, 412 and side surfaces 413, 414 of the laser 401. The side faces 413, 414 are scribed to form poorly optically reflective, rough surfaces.

When an electrical current is applied to the laser 401 via electrical contact 410 and another electrical contact (not shown) under the substrate 402, electrons are injected from the n-type cladding layer 404 while holes are injected from the p-type cladding layer 408. The relatively narrow width of the current injection ridge 409 in comparison to the width W of the laser 401 has the effect of concentrating the injection of electrons and holes towards a region extending under the current injection ridge 409 along the middle of the width of the laser 401. The electrons and holes migrate towards one another across the cladding layers 404, 408 and intrinsic waveguide layers 414, 415 to recombine. The recombination occurs primarily in the active regions 406 of the active layer 405.

Figure 7:
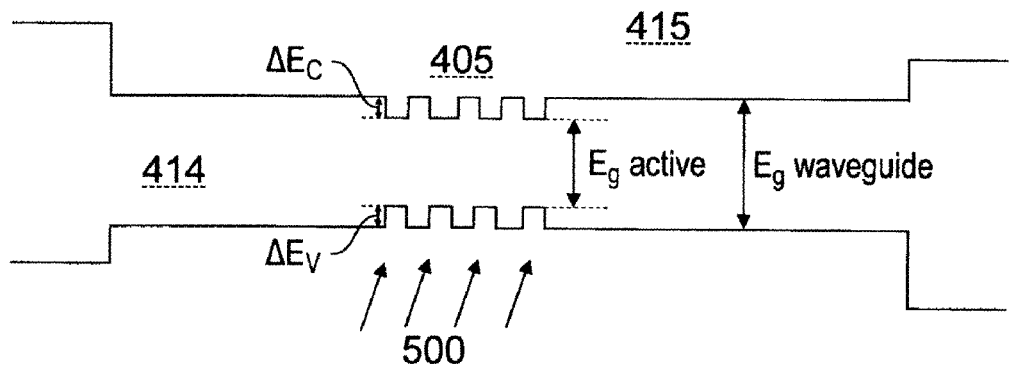

Referring to FIG. 7, the band gaps $E_g$ of the intrinsic waveguide layers 414, 415 and the barrier regions 407 of the active layer 405 are greater than the band gap $E_g$ of the active regions 406 of the active layer 405. Electrons and holes are confined within potential wells 500 created by each the active regions 406 of the active layer 405. Spontaneous emission of a photon occurs when an electron in the conduction band of the active regions 406 recombines with a hole in the valence band of the active regions 406. Stimulated emission of a photon takes place when an incident photon of energy close to that of the band gap $E_g$ of the active regions 406 interacts with an electron in the conduction band causing it to recombine with a hole in the valence band.

The difference in the refractive indices across the boundaries between the first intrinsic waveguide layer 414 and the n-type cladding layer 404 and between the second intrinsic waveguide layer 415 and the p-type cladding layer 408 causes emitted photons to be reflected at the boundaries at most angles of incidence. This confines the photons to an effective waveguide layer comprising the first and second intrinsic waveguide layers 414, 415 and the active layer 405. In addition, the reflective end faces 412, 413 cause the emitted photons to be reflected at each end of the laser 401 or, more specifically, the effective waveguide layer. This has the effect of increasing the density of photons within the effective waveguide layer and, more specifically, in the active regions 406 of the active layer 405. This increased photon density increases the probability of stimulated emission of photons in the active regions 406.

Figure 8:
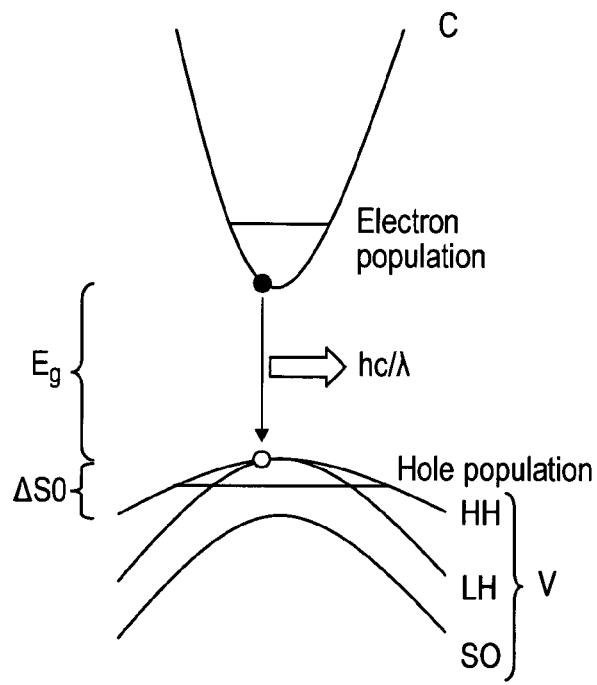
FIG. 8 is a graphical representation of the electronic band structure in a wide band gap semiconductor with an electron-hole pair undergoing light producing radiative recombination.

Referring to FIG. 8, an intermediate band gap semiconductor such as GaAs has a conduction band C and a valence band V separated by a band gap $E_g$=1.42 eV at 300K. In the Figure, the closed circles represent electrons and the open circles represent holes. Most basically, recombination of an electron from the conduction band C with a hole in the valence band V results in the emission of a photon that has energy equal to the energy lost by the electron and hole when they recombine, which is typically equal to the band gap $E_g$. Consequently, the emitted photon typically has wavelength $\lambda=hc/E_g$, where h is Planck's constant and c is the speed of light. However, the valence band V has a fine structure and is split into a heavy hole band HH, a light hole band LH and a spin-orbit band SO. The difference in energy between the top of the heavy hole band HH and the top of the spin orbit band SO is the spin-orbit splitting energy $\Delta S0$. Electrons and holes can also therefore undergo so-called Auger recombination and inter-valence band absorption (IVBA), both of which involve transitions within the fine structure of the valence band V. Neither of these processes results in generation of photons.

Figure 9:
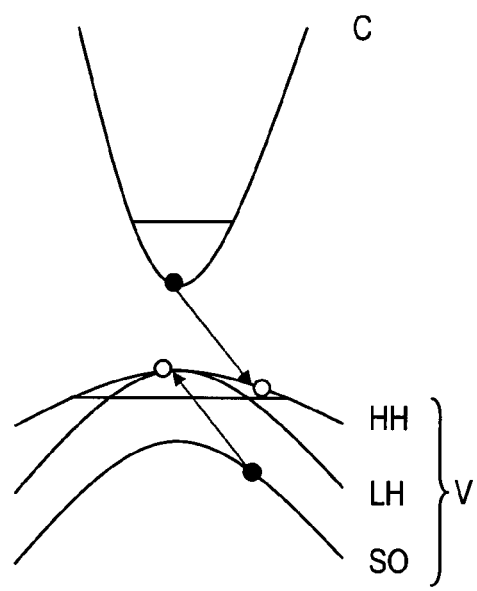
FIG. 9 is a graphical representation of the electronic band structure in a narrow band gap semiconductor with electrons and holes undergoing non-radiative CHSH Auger recombination.

In an Auger recombination process, the energy lost by the electron and hole when they recombine is given to another electron or hole that is excited further into its respective band. Thus, in Auger recombination, three carriers are involved: the initial electron-hole pair, plus an additional electron or hole. Referring to FIG. 9, in a conduction-hole-spin-hole (CHSH) Auger recombination process, the energy and momentum of an electron in the conduction band C and a hole in the valence band V that recombine are transferred to another hole in the valence band V. This hole is thereby excited from the heavy hole band HH of the valence band into the spin orbit band SO of the valence band V by transfer of an electron from the spin orbit band SO to the heavy hole band HH.

Figure 10:
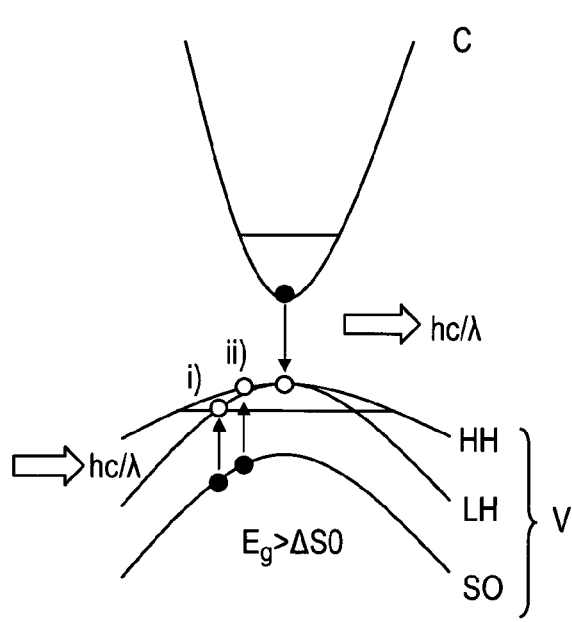
FIG. 10 is a graphical representation of inter-valence band absorption (IVBA) occurring in the electronic band structure of a narrow band gap semiconductor.

In an IVBA process, referring to FIG. 10, the photons produced by the stimulated or spontaneous emission processes may be reabsorbed before leaving the structure. In an IVBA process a photon causes a hole to be excited from the light hole band LH of the valence band to the spin-orbit band SO of the valence band V by transfer of an electron from the spin-orbit band SO to the light hole band LH. Alternatively, the hole is excited from the heavy hole band HH to the spin-orbit band SO by transfer of an electron from the spin-orbit band SO to the heavy hole band HH. The incident photon is absorbed.

In materials with a relatively large band gap $E_g$ the probability of Auger recombination is small due to the near-vertical transitions that are required on the energy-momentum diagram. In materials with a relatively small band gap $E_g$ where light is emitted at relatively long wavelengths, i.e. near-IR and mid-IR (wavelength range 1.3-2.0 µm), Auger recombination and IVBA dominate. FIGS. 9 and 10 show the band structure of a material with a relatively small band gap $E_g$, such as InGaAs where $E_g$=0.8 eV at 300K.

Figure 11A:
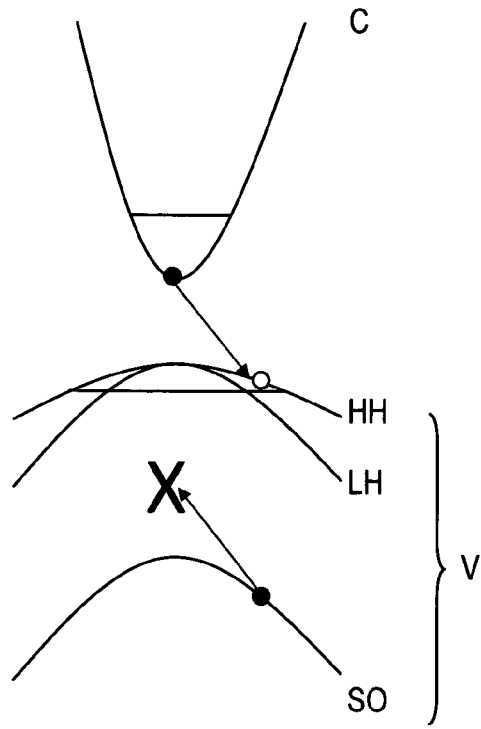
FIG. 11a is a graphical representation of the electronic band structure in a narrow band semiconductor where the spin-orbit splitting energy is greater than the band gap causing the non-radiative CHSH Auger recombination process to be suppressed.
Figure 11B:
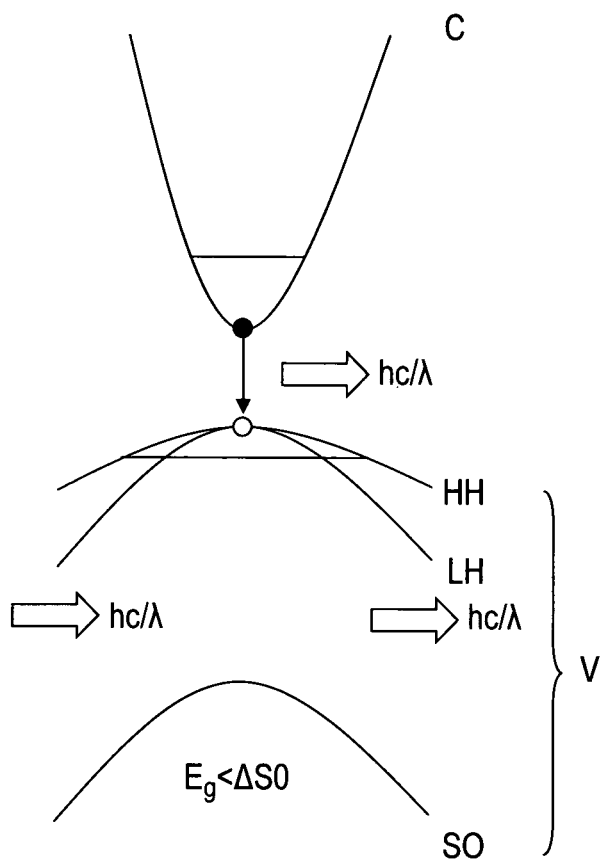
FIG. 11b is a graphical representation of the suppression of IVBA in a narrow band semiconductor where the spin-orbit splitting energy is greater than the band gap.

Referring to FIG. 11a, the band structure of the GaAs$_{1-x}$Bi$_x$ material of the active regions 406 of the laser 401 of the first preferred embodiment has the spin-orbit splitting energy ΔS0 is larger than the band gap energy $E_g$. This means that the transition of an electron from the spin-orbit band SO to the light hole band LH or heavy hole band HH is very unlikely to occur, as not enough energy is released by recombination of an electron from the conduction band C and a hole from the valance band V. In other words, there is no available state for the electron to move into. CHSH Auger recombination is therefore suppressed in a material having this band structure. Similarly, referring to FIG. 11b, IVBA is suppressed as an incident photon is unlikely to cause the transfer of carriers between the spin-orbit band SO and the heavy hole or light hole bands HH, LH. Instead, the incident photon stimulates the emission of a photon as an electron from the conduction band C recombines with a hole from the valence band V but is not itself absorbed.

The spread of carrier energies and momenta in the conduction and valence bands C, V increases with increasing temperature. In materials having the band structures illustrated in FIGS. 9 and 10, the amount of Auger recombination and IVBA therefore varies strongly with temperature. In particular, for a material having a small band gap $E_g$, as required for emission of photons at IR wavelengths, Auger recombination and IVBA dominate at room temperature. Devices using such materials therefore tend to have unstable light emission characteristics and require some form of temperature control for stabilisation. On the other hand, Auger recombination and IVBA are improbable in the GaAs$_{1-x}$Bi$_x$ material of the active regions 406 of the laser 401 of the first preferred embodiment at room temperature. This means that the light emission characteristics of the laser 401 are stable and the need for temperature control can be avoided.

Figure 12:
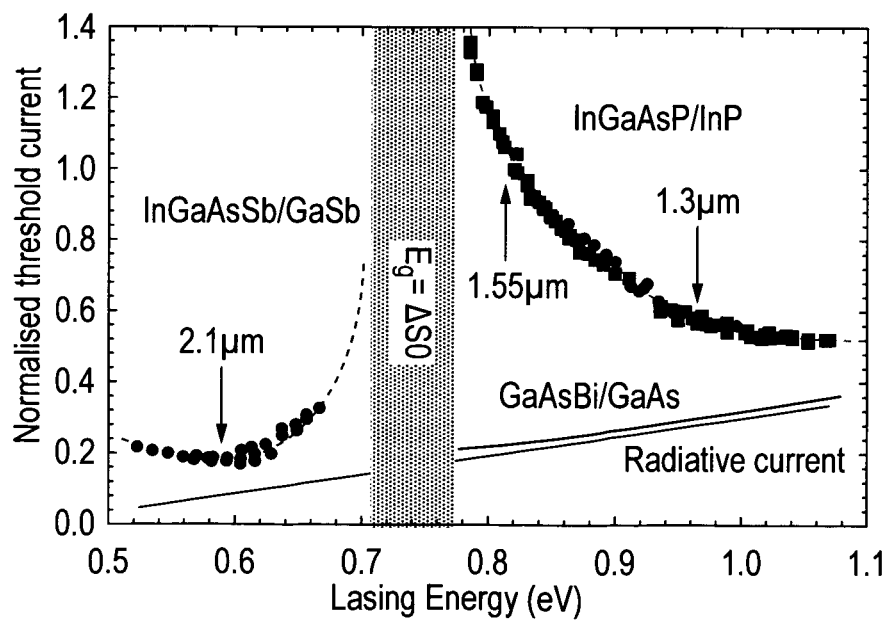
FIG. 12 is a graph showing the dependence of threshold current with lasing energy in InP, GaSb and GaAsBi compounds.

FIG. 12 shows how threshold current $I_{th}$ varies as a function of lasing energy for each of three different lasers 401 having active regions 406 comprising different materials. Lasing energy is a function of the band gap $E_g$ and each laser 401 is tested at different band gap $E_g$ and hence different wavelength of emitted light. A region in which band gap $E_g$ is equal to spin-orbit splitting energy ΔSO for the lasers 401 having active regions 406 of InGaAsP and InGaAsSb is shaded. For a laser 401 having an active region 406 of InGaAsP, threshold current $I_{th}$ increases with decreasing lasing energy as CHSH Auger recombination and IVBA start to dominate. For a laser 401 having an active region 406 of InGaAsSb, CHSH Auger recombination and IVBA are suppressed as the band gap $E_g$ is less than the spin-orbit splitting energy ΔSO. However, the wavelength of light emitted by the InGaAsSb laser 401 is around 2 µm and therefore outside the near infrared wavelength range required of lasers in communications systems. For the laser 401 of the first preferred embodiment having an active region 406 of GaAs$_{1-x}$Bi$_x$, the threshold current $I_{th}$ increases linearly with lasing energy. Indeed, the threshold current $I_{th}$ follows the radiative current, as the laser 401 enjoys the benefit of suppressed CHSH Auger recombination and IVBA. However, this laser also emits light in the near infrared region required of lasers in communications systems.

Figure 13:
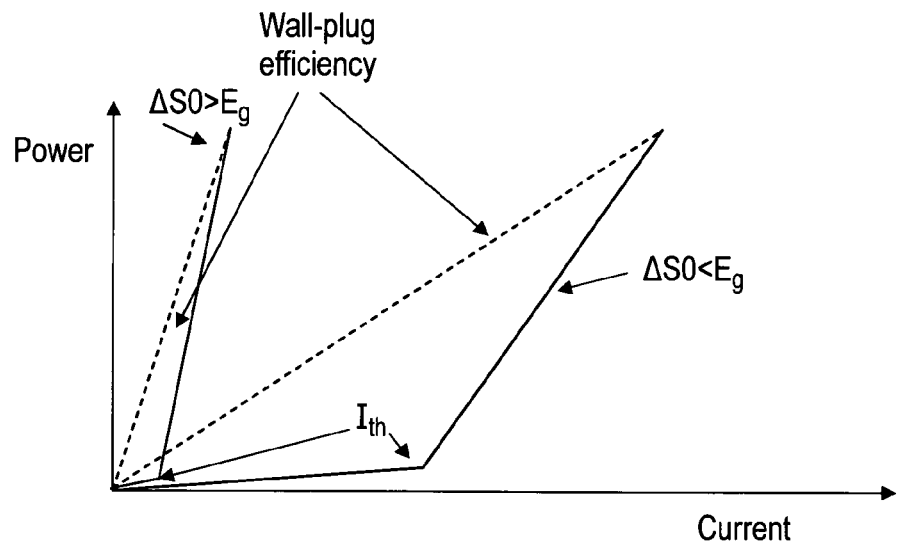

FIG. 13 shows a comparison of the optical power of light output by the laser 401 against input electrical current when the active regions 406 comprise for either a material in which band gap Eg is greater than the spin-orbit splitting energy ΔSO or band gap Eg is less than the spin-orbit splitting energy ΔSO. It can be seen that for a material having band gap $E_g$ is less than the spin-orbit splitting energy ΔSO, $E_g$<ΔSO, the threshold current $I_{th}$ shown by the point at which optical power begins to increase more quickly with input current, is less and the slope efficiency is more than for a material having band gap $E_g$ greater than the spin-orbit splitting energy ΔSO, $E_g$>ΔSO. The gradient of a line drawn between the origin and a point of constant optical power on the curve is a measure of the so-called "wall-plug efficiency" and represents the total electrical to optical power efficiency. A large wall-plug efficiency is desirable because it represents the amount of electrical power consumed and the fraction of electrical power converted to light. It can be seen that a material having band gap $E_g$ less than the spin-orbit splitting energy ΔSO has reduced the threshold current $I_{th}$, increased the slope efficiency and increased wall-plug efficiency in comparison to a material having band gap $E_g$ greater than the spin-orbit splitting energy ΔSO.

Figure 14:
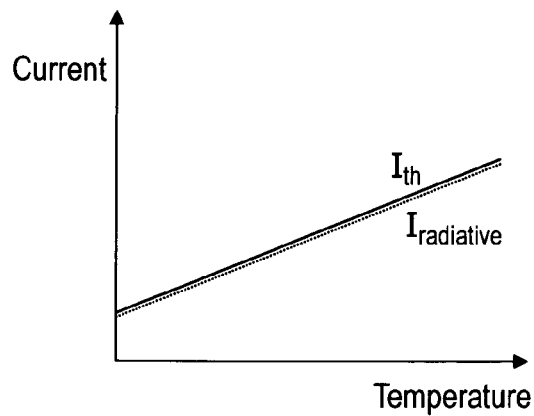

FIG. 14 shows how the temperature stability of the laser 401 of the first preferred embodiment is improved by the addition of Bismuth. It can be seen that the response of threshold current $I_{th}$ to increases in temperature is close to linear, which is much more desirable than the exponential response of the prior art. The response over the 20-70 deg C. range is approximately constant and therefore no separate temperature stabilising system is required. The threshold current $I_{th}$ follows the radiative current.

As the addition of Bismuth narrows the band gap $E_g$ of the GaAs$_{1-x}$Bi$_x$ alloy, so the wavelength of the emitted light increases. In most applications, particularly in telecommunications, it is important to be able to select the wavelength of emitted light. For instance, telecommunications systems operate between 1.3-1.55 µm and resolving wavelengths is fundamental to the technique of wavelength division multiplexing. In the first preferred embodiment, it is possible to select the wavelength of emitted light in a number of ways, including the further addition of Bismuth, adjusting the thickness of the active regions 406 or by the addition of other group III or group V elements so as to select the wavelength and to control the strain in the layers. Each method is discussed below.

The further addition of Bismuth will increase the wavelength of emitted light. Therefore, the wavelengths that are accessible by adding further Bismuth are around 1.5 µm and above. The maximum amount of Bismuth that can be added is limited because the large size of the Bismuth atom introduces strain into the structure.

Figure 15:
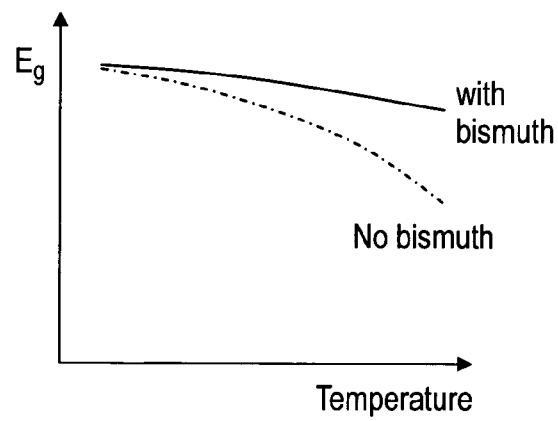
FIG. 15 is a graph showing the dependence of band gap on temperature in a prior art GaAs compound and in the GaAsBi compound of a preferred embodiment.

Another feature of the addition of Bismuth to III-V compounds is that it improves the stability of the emitted wavelength to fluctuations in temperature. This is illustrated in FIG. 15.

Increasing the thickness of the active regions 406 increases the wavelength of, emitted light. The number of active regions 406 may be varied, from a single region 406, or single quantum well, up to 10 regions 406 or more, although this will not significantly affect the wavelength of emitted light but will affect the efficiency.

A second preferred embodiment of the invention may also be understood with reference to FIGS. 4a, 4b, 5 and 6. The second preferred embodiment provides a laser 401 having a similar structure to the laser 401 of the first preferred embodiment. In fact, all features of the second preferred embodiment are identical to that of the first preferred embodiment with the exception of the composition of the active regions 406.

The difference between the first and second preferred embodiments is that the active regions 406 comprise a further element in addition to the Gallium, Arsenic and Bismuth described above in relation to the first preferred embodiment.

FIG. 6 illustrates that introducing a further element into the active regions 406 reduces the band gap $E_g$, meaning that the percentage of Bismuth required so that the magnitude of the spin-orbit splitting energy $\Delta SO$ exceeds that of the band gap $E_g$ is also reduced. FIG. 6 illustrates the following: the band gap $E_g$ in the active region according to the first preferred embodiment, i.e. when Bismuth alone is introduced to the Gallium Arsenide (line 601); the band gap when both Bismuth and Nitrogen (N) are introduced (line 602); and the band gap when both Bismuth and Indium (In) are introduced (line 603). It can be seen from FIG. 6 that introducing Nitrogen or Indium reduces the cross-over point at which the spin-orbit splitting energy $\Delta SO$ exceeds the band gap $E_g$. Moreover, as the band gap $E_g$ at the cross-over point is reduced, this means that higher wavelengths (above 1.2 μm, for example) are available.

Preferably, the further element introduced in to the active region 406 in the second preferred embodiment is a group V element. Most preferably, Nitrogen is introduced as the further element. Nevertheless, Phosphorous (P) and Antimony (Sb), for example, may alternatively or additionally be used. Preferably, the percentage of atoms of group V elements in the active region 406 that are Nitrogen is less than or equal to 10%, more preferably, less than or equal to 5%. In this embodiment, the percentage of atoms of group V elements in the active region 406 that are Bismuth is preferably in the range 3% to 15%.

Figure 16A:
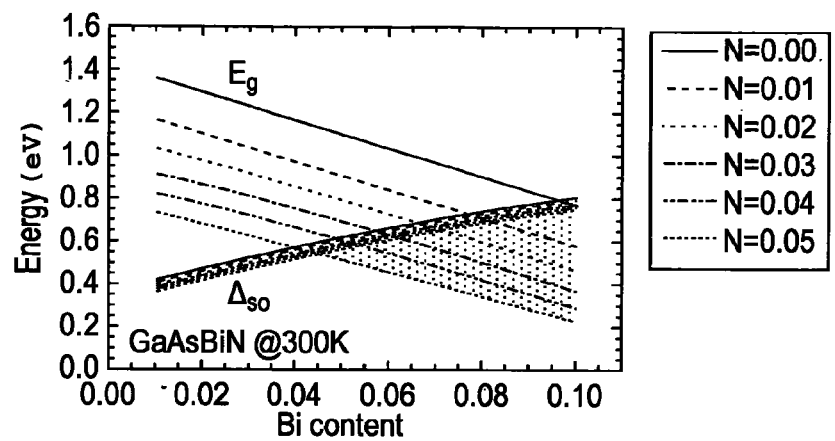
FIG. 16a is a graph showing the relationship between the spin orbit splitting energy $\Delta_{SO}$ and band gap $E_g$ of GaAsBiN as a function of Bismuth concentration for various concentrations of Nitrogen.

FIG. 16A illustrates the effect of introducing Nitrogen in more detail. FIG. 16A shows the band gap $E_g$ and the spin-orbit splitting energy $\Delta SO$ as a function of the percentage of Bismuth for materials containing different quantities of Nitrogen. As can be seen from FIG. 16A, increasing the quantity of Nitrogen substantially reduces the band gap $E_g$ for a given percentage of Bismuth. At the same time, due to its low atomic number, the introduction of Nitrogen has a minimal effect of the spin-orbit splitting energy $\Delta SO$.

Another advantage associated with the introduction of Nitrogen is an increase in the conduction band offset $\Delta E_C$ between the active region and the GaAs layers. The conduction band offset $\Delta E_C$ is shown in FIG. 7. This combines with an increase in the valence band offset $\Delta E_V$ (also illustrated in FIG. 7) which results from the introduction of Bismuth to reduce carrier leakage effects in the active layers 406.

Accordingly, introducing both Bismuth and Nitrogen into the active layers allows control of both Auger recombination and carrier leakage effects. Auger recombination is inhibited by control of the band gap $E_g$ relative to the spin-orbit splitting energy $\Delta SO$, while carrier leakage is reduced by an increase in the conduction band offset $\Delta E_C$ and the valence band offset $\Delta E_V$. Advantageously, Auger recombination and carrier leakage effects can be controlled in photonic devices, such as LEDs and lasers, which emit light at near and mid-infrared wavelengths.

Figure 16B:
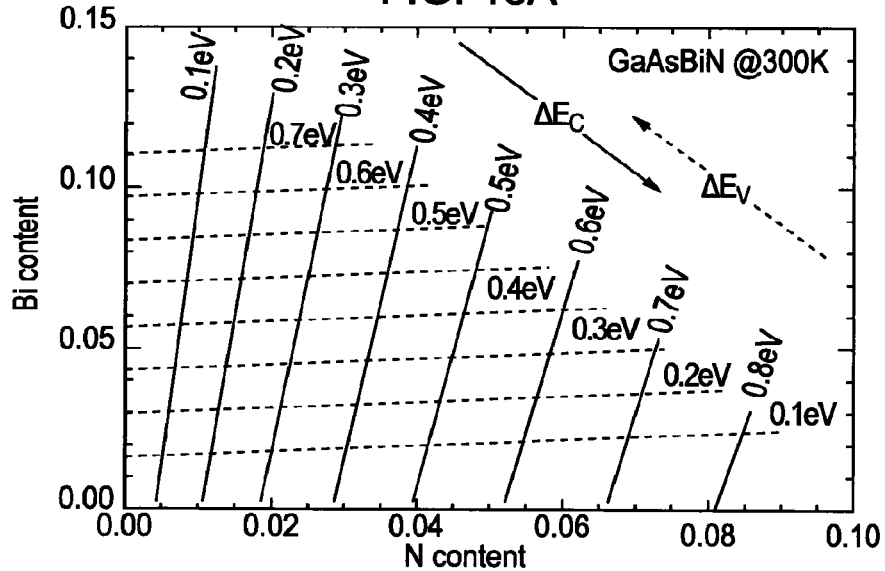
FIG. 16b is a graph showing the dependence of the valence band offset $\Delta E_V$ and the conduction band offset $\Delta E_C$ at a GaAs/GaAsBiN heterojunction on the Bismuth and Nitrogen concentrations in the GaAsBiN layer.

FIG. 16B illustrates the effect of Bismuth and Nitrogen on the valence band offset $\Delta E_V$ and the conduction band offset $\Delta E_C$. Various values of valence band offset $\Delta E_V$ and conduction band offset $\Delta E_C$ at heterojunction between GaAs and GaAsBiN are plotted on a graph of Bismuth content against Nitrogen content. It can clearly be seen from FIG. 16B that an increase in Nitrogen content increases the conduction band offset $\Delta E_C$, while an increase in Bismuth content increases the valence band offset $\Delta E_V$.

Figure 16C:
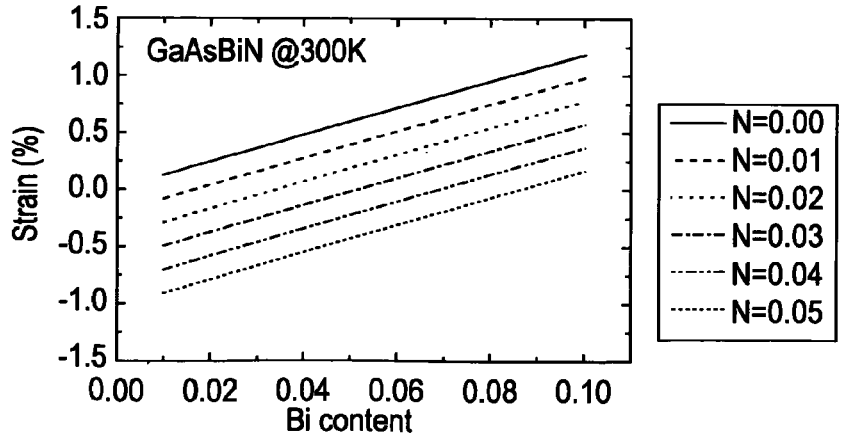
FIG. 16c is a graph showing the relationship between strain in a GaAsBiN layer and the Bismuth concentration for a various concentrations of Nitrogen.

A further advantage of the introduction of Nitrogen is a reduction of the strain in the device. FIG. 16C illustrates the effect of the introduction of Nitrogen on the strain at an interface between a GaAs layer and a layer of GaAsBiN as a function of the percentage of Bismuth. FIG. 16C clearly shows that an increase in the percentage of Bismuth increases the amount of strain, while the introduction of Nitrogen counteracts this effect. As such, introducing Nitrogen can assist in the manufacturability of the device.

Another preferred embodiment of the invention may also be understood with reference to FIGS. 4a, 4b, 5 and 6. All the features of this preferred embodiment are identical to that of the first preferred embodiment with the exception of the composition of the active regions 406. The difference between the first preferred embodiment and this preferred embodiment is that each of the active regions 406 comprises two layers (not shown), one on top of the other. In each of the active regions, a first of the two layers comprises the III-V material including Bismuth and a second of the two layers comprises another III-V material. For example, the first layer comprises GaAsBi and the second layer comprises GaAsN. This causes the relevant energy bands in each active region 406 to be de-localised from one another, and has the advantage of further restricting Auger recombination processes in the active regions 406. This structure is known as "type II alignment".

In the above embodiments, the III-V compound selected for alloying with Bismuth and, where appropriate, one or more other group V elements, is GaAs. That is, GaAs is alloyed with Bismuth or Bismides such as BiN. However, other binary compounds may be used in the place of GaAs, such as InAs, AlAs, GaP, InP, AlP, GaN, InN, AlN, GaSb, InSb, AlSb. Ternary compounds based on these binaries such as GaInAs and GaInP may also be used. Furthermore, pentanary or quaternary compounds based on these ternaries such as GaInAsSb may be used.

In the above embodiments, a quantum well structure is used. However, one skilled in the art will recognise that devices using quantum wire or quantum dot structures may also be used in accordance with the present invention. Indeed, a particular preferred embodiment of the invention using a quantum dot structure having quantum dots of GaAsBiN within GaAs. In this embodiment, as demonstrated by FIGS. 12B to 12D, it is possible to select proportions of Bismuth and Nitrogen in which the following conditions are satisfied: band gap $E_g$<conduction band offset $\Delta E_C$; band gap $E_g$<valence band offset $\Delta E_V$; and band gap $E_g$<spin-orbit splitting ΔSO. Using a quantum dot structure fulfilling these criteria it is possible to eliminate Auger recombination entirely.

DFB Laser

Figure 17:
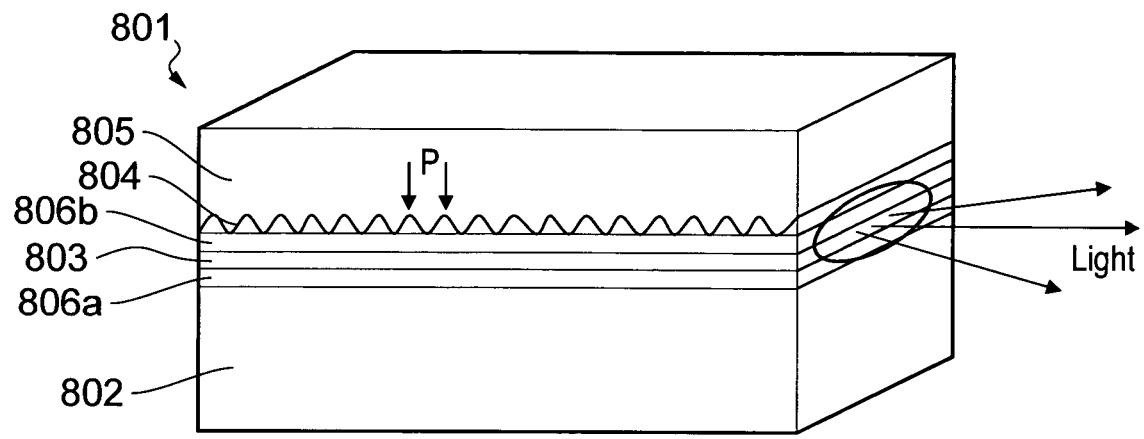
FIG. 17 is a schematic representation of a distributed feedback laser having an active region comprising $GaAs_{1-x}Bi_x$.

In another embodiment, a distributed feedback (DFB) laser is provided having an active region 803 comprising $GaAs_{1-x}Bi_x$ wherein the percentage x of atoms of group V elements in the $GaAs_{1-x}Bi_x$ that are Bismuth (Bi) is selected such that the spin-orbit splitting energy ΔS0 of the $GaAs_{1-x}Bi_x$ is greater than the band gap energy $E_g$ of the $GaAs_{1-x}Bi_x$. FIG. 17 illustrates the structure of such a DFB laser 801. A cladding layer 802 of n-type AlGaAs is grown by MBE onto a GaAs substrate. On top of this the lower half of a GaAs waveguide layer is grown 804a. An active region 803 of $GaAs_{1-x}Bi_x$ is grown onto the waveguide layer 804a to a thickness of 10 nm to form a quantum well structure. Multiple quantum wells may be used as described in relation to the laser 401 of the first preferred embodiment and shown in FIG. 4b. On top of the active region 803 the upper half of the GaAs waveguide 806b is grown above which a Bragg grating 804 is formed. The grating 804 is formed by etching back parts of the upper GaAs waveguide 806b and over growing with a p-type AlGaAs cladding layer 805. This forms periodic variations in refractive index along the laser cavity, having a pitch P between each ridge. The corrugations in the grating layer 804 provide a periodic variation in the refractive index along the laser cavity and hence the optical feedback is distributed along the length of the cavity. The forward and backward propagating waves will only interfere constructively if their frequency is related to the pitch of the grating, and the allowed modes lie either side of the Bragg frequency of the grating. Introducing a quarter-length shift in the Bragg reflector means that one of the modes will lase preferentially.

DFB lasers are used extensively in optical communication systems because of their single mode behaviour and narrow line widths. This allows simultaneous transmission of several data channels at closely spaced wavelengths around the fibre attenuation minimum of 1.55 μm. The inclusion of a fraction of Bismuth in the GaAs alloy of the active region 803 such that ΔS0>Eg suppresses non-radiative recombination processes and increases the efficiency of the device. Suppression of temperature dependent non-radiative recombination processes means that the device is inherently stable over a range of temperatures and therefore temperature control systems are not required.

VCSEL/RCLED

Figure 18:
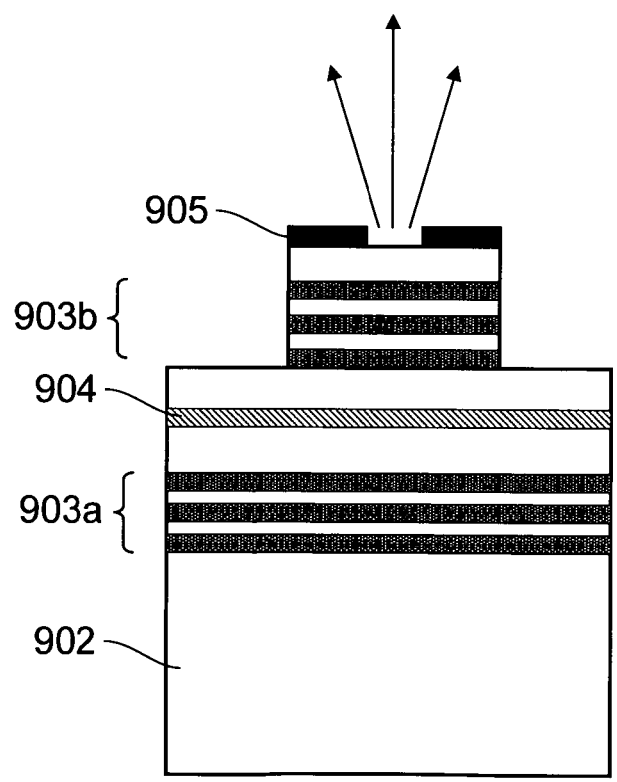
FIG. 18 is a schematic representation of a vertical cavity surface emitting laser or resonant cavity light emitting diode having an active region comprising $GaAs_{1-x}Bi_x$.

In another embodiment a vertical cavity surface emitting laser (VCSEL) is provided. The device has a similar structure to a resonant cavity LED (RCLED). Referring to FIG. 18, an n-type layer of GaAs 902 is grown on a GaAs substrate (not shown). Next, quarter-wavelength thick layers of AlGaAs is grown, alternating with quarter-wavelength thick layers of GaAs to form a distributed Bragg reflector stack 903a. An active layer 904 of $GaAs_{1-x}Bi_x$ is sandwiched between the reflector stack 903a and a further stack 903b. The active layer 904 is grown to form a quantum well structure as per 405. The cavity length is 0.1 μm, which is much shorter than for an edge emitting device, and therefore the reflectors have to have a reflectivity of >99%. The optical cavity lies in the same direction as the growth direction and the light output is from the surface. At the surface an electrode 905 having a circular aperture 906 is deposited. The fraction of Bismuth in the alloy is selected so that spin-orbit splitting energy ΔS0 is greater than band gap Eg and therefore non-radiative processes are suppressed and the temperature stability of the wavelength is improved.

Thus, in the VCSEL of the embodiment the input current is converted efficiently to light output. Furthermore, the absence of non-radiative Auger recombination and IVBA means that the output is independent of temperature and temperature stabilising electronics are not necessary. Further elements may be added such as N or In to tune the output wavelength to a desired value.

VCSOA/VECSEL

In a further embodiment a vertical cavity semiconductor optical amplifier (VCSOA) or Vertical External Cavity Surface Emitting Lasers (VECSEL) is provided. The structure is similar to the VCSEL of FIG. 18, but the reflectivity of the upper Bragg reflector stack 903b is reduced so that the laser threshold is not reached. The still-significant top reflectivity is required for generating a reasonably high gain, since the single pass gain through a quantum well is fairly low. As with the edge emitting SOA described above, the active region is a $GaAs_{1-x}Bi_x$ alloy, where x is selected such that spin-orbit splitting energy ΔS0 is greater than band gap $E_g$. This allows the conventional thermal management systems associated with these devices to be omitted and increases the differential gain of the SOA.

LED

Figure 19:
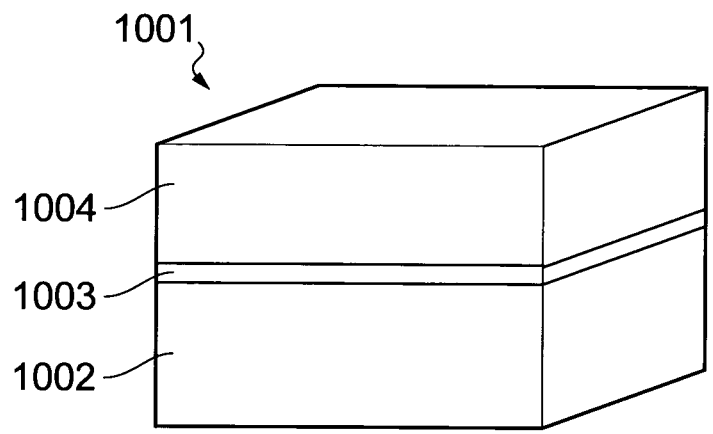
FIG. 19 is a schematic representation of a LED having an active region comprising $GaAs_{1-x}Bi_x$.

Referring to FIG. 19, a light emitting diode 1001 has an active layer 1003 of GaAsBi sandwiched between n-type GaAs 1002 and p-type GaAs 1004. When a current flows through the device, spontaneous emission of light occurs from the active layer 1003. The Bismuth fraction in the GaAsBi layer is selected so that the spin-orbit splitting energy ΔSO is greater than the band gap $E_g$, and therefore the probability of Auger and IVBA processes occurring is greatly reduced. The efficiency of the device is therefore increased.

Superluminescent LED

Figure 20:
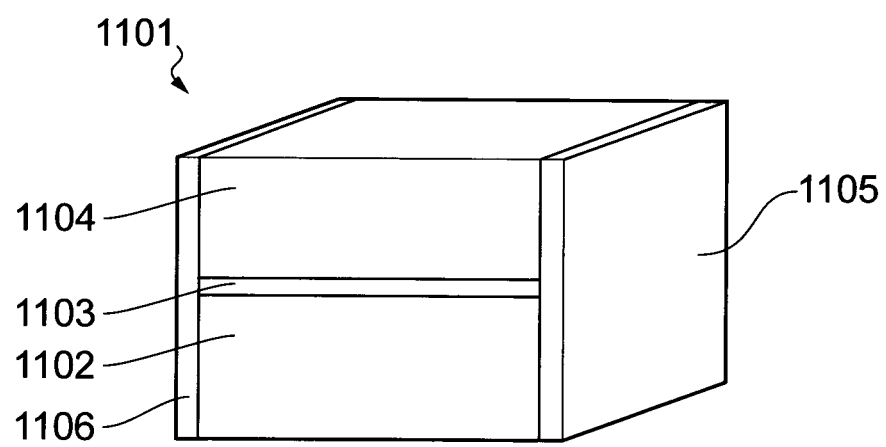
FIG. 20 is a schematic representation of a superluminescent LED having an active region comprising $GaAs_{1-x}Bi_x$.

Referring to FIG. 20, a superluminescent LED 1101 has an active region 1103 of GaAsBi sandwiched between n-type GaAs 1102 and p-type GaAs 1104. Anti-reflective coatings 1105 and 106 are provided at either end of the device, and in this respect it has the same construction as an edge-emitting semiconductor optical amplifier but without a waveguide. The other difference is that there is no input signal to the SLED. In fact the SLED should be carefully protected against external optical feedback because even small levels of feedback can reduce the overall emission bandwidth and the output power, or sometimes even lead to parasitic lasing causing narrow spikes in the emission spectrum. The proportion of Bismuth in the active region is selected in so that the spin-orbit splitting energy ΔSO is greater than the band gap $E_g$.

SOA

Figure 21:
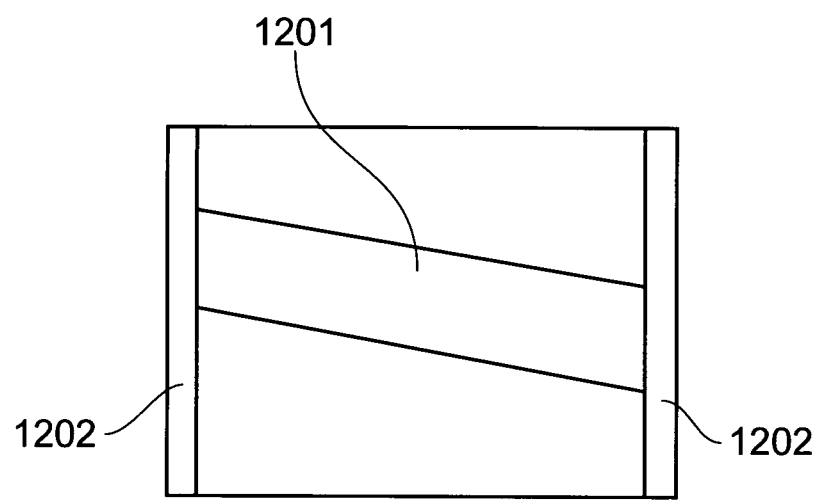
FIG. 21 is a schematic representation of a semiconductor optical amplifier having an active region comprising $GaAs_{1-x}Bi_x$.

In a further embodiment a semiconductor optical amplifier (SOA) is provided. As a light pulse propagates through a communication system the pulse becomes attenuated until it is necessary to regenerate the pulse to keep it above the background noise level. Semiconductor optical amplifiers are used to boost the signal, whereby input photons stimulate the emission of further photons. The structure is similar to an edge emitting laser and is illustrated in plan view in FIG. 21. The main difference between an edge emitting laser and a SOA is that the SOA has an angled ridge 1201 with respect to the end facets. Also, anti-reflective coatings 1202 are provided to suppress reflections at the ends of the device to prevent lasing and minimise losses through reflections. The active region of the device is $GaAs_{1-x}Bi_x$ where the fraction of Bismuth is selected in order to ensure that the spin-orbit splitting ΔS0 is greater than the band gap $E_g$, which increases the differential gain of the SOA. This eliminates the need for a TEC to maintain the device at a constant temperature.

The quantity of Bismuth in the material can be determined using Secondary Ion Mass Spectroscopy (SIMS). In SIMS the sample is subjected to a stream of high energy ions which gradually erode through the layers of the sample. As the ions pass through the structure, they sputter off the elements inside the structure forming secondary ions. These are analysed in a Mass Spectrometer which gives precise information about the concentration of individual elements in the structure. This therefore provides a direct measure of Bismuth in the sample which shows whether or not the Bismuth fraction exceeds the level for which $\Delta S0$ is greater than the band gap $E_g$.

Figure 22:
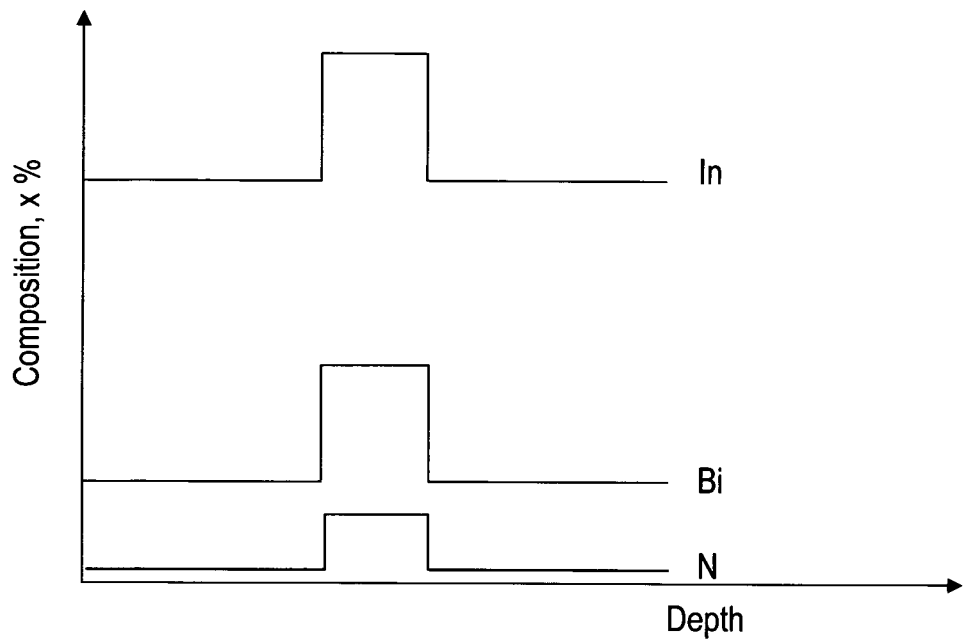
FIG. 22 is a graph showing a typical secondary ion mass spectroscopy plot for a sample of material containing Bi, In and N.

FIG. 22 shows a typical SIMS plot, where a section of active region 405 of the edge-emitting laser 401 including additional Indium and Nitrogen is analysed. Peaks in Bismuth, Indium and Nitrogen can be seen and the heights of these peaks indicates the relative proportion of each material in the sample. In this way, the value of x in a sample of $GaAs_{1-x}Bi_x$ may be determined.

Figure 23:
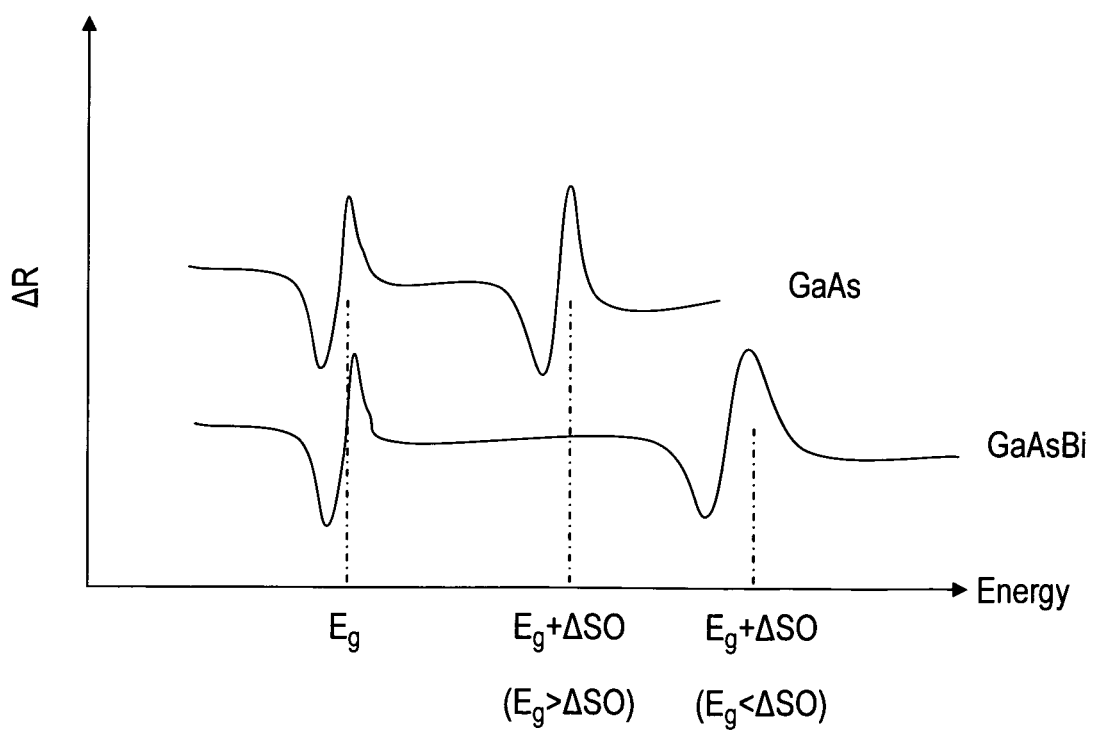
FIG. 23 is a graph showing a typical reflectance spectroscopy plot for samples of GaAs and GaAsBi, where the peak due to $E_g + \Delta SO$ is further from $E_g$ in the GaAsBi sample because $\Delta SO$ is greater than $E_g$ in this sample.

Optical spectroscopy may also be used to measure the spin-orbit splitting energy $\Delta S0$ and band gap $E_g$ directly. For example, in photomodulation spectroscopy, the sample is illuminated with light from a monochromator and a chopped laser beam. By analysing the reflectance of the sample with and without the laser switched on, the values of spin-orbit splitting energy $\Delta S0$ and band gap $E_g$ may be determined, from which it is possible to say whether the condition that spin-orbit splitting energy $\Delta S0$ is greater than the band gap $E_g$ has been met in the sample. FIG. 23 shows a typical output from the spectrometer. A peak at low energy is seen due to the absorption of photons as carriers make the transition across the band gap and the energy of this peak represents the band gap energy $E_g$. A further peak in reflectivity at a higher energy is associated with transitions between the spin-orbit band across the band gap to the conduction band. The energy at this point therefore represents the band gap energy $E_g$ plus the spin-orbit energy. For materials where the spin-orbit energy $\Delta S0$ is not large compared to the band gap $E_g$, the peak at higher energy will be relatively close to the peak at lower energy. For the material $GaAs_{1-x}Bi_x$, where x is selected such that spin-orbit splitting energy $\Delta S0$ is greater than band gap $E_g$ then the $E_g+\Delta S0$ peak will be further from the $E_g$ peak than the $E_g$ peak is from zero.

It is to be understood that various modifications to the preferred embodiment and the generic principles and features described herein will be readily apparent to those skilled in the art. Thus, the present invention is not intended to be limited to the embodiment shown and such modifications and variations also fall within the spirit and scope of the appended claims.

The invention claimed is:

1. A light emitting semiconductor device having an active region comprising a III-V material including Bismuth and one or more other group V elements, wherein the percentage of atoms of Bismuth to atoms of the other group V elements in the material is in the range 3% to 15% and is such that the spin-orbit splitting energy of the material is greater than the band gap energy of the material, and wherein the device emits light having wavelength between 1.3 µm and 2.0 µm.

2. A light emitting semiconductor device according to claim 1, wherein the percentage of atoms of Bismuth to atoms of the other group V elements in the material is in the range 5% to 15%.

3. A light emitting semiconductor device in accordance with claim 1, wherein the percentage of atoms of Bismuth to atoms of the other group V element(s) in the material is approximately 10%.

4. A light emitting semiconductor device in accordance with claim 1, wherein the III-V material includes Gallium.

5. A light emitting semiconductor device in accordance with claim 1, wherein the other group V element or one of the other group V elements is Arsenic.

6. A light emitting semiconductor device in accordance with claim 1, wherein one of the other group V elements is Nitrogen.

7. A light emitting semiconductor device in accordance with claim 6, wherein the percentage of atoms of Nitrogen to atoms of Bismuth and the other group V element(s) except Nitrogen in the material is less than or equal to 10%.

8. A light emitting semiconductor device in accordance with claim 6, wherein the percentage of atoms of Nitrogen to atoms of Bismuth and the other group V element(s) except Nitrogen in the material is less than or equal to 5%.

9. A light emitting semiconductor device in accordance with claim 1, wherein the III-V material is GaAsBiN.

10. A light emitting semiconductor device in accordance with claim 1, wherein the III-V material is GaInAsBi.

11. A light emitting semiconductor device in accordance with claim 1, wherein the III-V material is GaInPBi.

12. A light emitting semiconductor device in accordance with claim 1, wherein the active region comprises a first portion comprising the III-V material including Bismuth and the one or more other group V elements, and a second portion comprising another III-V material.

13. A light emitting semiconductor device in accordance with claim 1, wherein the device is a laser.

14. A light emitting semiconductor device in accordance with claim 13, wherein the device is an edge-emitting laser, distributed feedback laser or vertical cavity surface emitting laser.

15. A light emitting semiconductor device in accordance with claim 1, wherein the device is a light emitting diode.

16. A light emitting semiconductor device in accordance with claim 15, wherein the device is a super-luminescent light emitting diode.

17. A light emitting semiconductor device in accordance with claim 1, wherein the device is an optical amplifier.

18. A light emitting semiconductor device in accordance with claim 17, wherein the device is a vertical cavity semiconductor optical amplifier.

19. A method of manufacturing the light emitting semiconductor device of claim 1, the method comprising providing as an active region a III-V material including Bismuth and one or more other group V elements, wherein the percentage of atoms of Bismuth to atoms of the other group V elements in the material is in the range of 3% to 15% and is such that the spin-orbit splitting energy of the material is greater than the band gap energy of the material, and wherein the device emits light having wavelength between 1.3 µm and 2.0 µm.

20. A III-V material including Bismuth and one or more other group V elements, wherein the percentage of atoms of Bismuth to atoms of the other group V elements in the material is in the range 3% to 15% and is such that the spin-orbit splitting energy of the III-V material is greater than the band gap energy of the III-V material, and wherein the material is used to emit light having wavelength between 1.3 µm and 2.0 µm.

21. A light emitting semiconductor device having an active region comprising III-V material including Bismuth and two or more other group V elements, wherein the percentage of atoms of Bismuth to atoms of the other group V elements in the material is such that the spin-orbit splitting energy of the material is greater than the band gap energy of the material, and wherein the device emits light having wavelength between 1.3 μm and 2.0 μm.

22. A III-V material including Bismuth and two or more other group V elements, wherein the percentage of atoms of Bismuth to atoms of the other group V elements in the material is such that the spin-orbit splitting energy of the material is greater than the band gap energy of the material, and wherein the material is used to emit light having wavelength between 1.3 μm and 2.0 μm.

23. A method of manufacturing a light emitting semiconductor device, the method comprising providing as an active region a III-V material including Bismuth and one or more other group V elements, wherein the percentage of atoms of Bismuth to atoms of the other group V elements in the material is such that the spin-orbit splitting energy of the material is greater than the band gap energy of the material, and wherein the device emits light having wavelength between 1.3 μm and 2.0 μm.

* * * * *